United States Patent
Ghassemi et al.

(10) Patent No.: US 9,867,294 B2
(45) Date of Patent: Jan. 9, 2018

(54) MULTI-WIDTH WAVEGUIDES

(71) Applicants: Nasser Ghassemi, Ottawa (CA); Hugues Tournier, Gatineau (CA)

(72) Inventors: Nasser Ghassemi, Ottawa (CA); Hugues Tournier, Gatineau (CA)

(73) Assignee: Ciena Corporation, Hanover, MD (US)

( * ) Notice: Subject to any disclaimer, the term of this patent is extended or adjusted under 35 U.S.C. 154(b) by 161 days.

(21) Appl. No.: 14/720,656

(22) Filed: May 22, 2015

(65) Prior Publication Data

US 2016/0344084 A1    Nov. 24, 2016

(51) Int. Cl.
| | |
|---|---|
| *H05K 5/00* | (2006.01) |
| *H05K 3/34* | (2006.01) |
| *H05K 1/18* | (2006.01) |
| *H05K 1/02* | (2006.01) |
| *H01P 5/02* | (2006.01) |
| *H01P 3/00* | (2006.01) |

(52) U.S. Cl.
CPC ............... *H05K 3/34* (2013.01); *H01P 3/006* (2013.01); *H01P 5/028* (2013.01); *H05K 1/0237* (2013.01); *H05K 1/18* (2013.01)

(58) Field of Classification Search
USPC ........................................ 361/783, 760, 717
See application file for complete search history.

(56) References Cited

U.S. PATENT DOCUMENTS

| | | | |
|---|---|---|---|
| 5,184,095 A | 2/1993 | Hanz et al. | |
| 2010/0321250 A1* | 12/2010 | Sorvala | H01Q 1/243 343/700 MS |
| 2012/0242421 A1 | 9/2012 | Robin et al. | |
| 2015/0097633 A1 | 4/2015 | DeVries et al. | |
| 2015/0097634 A1 | 4/2015 | Ghassemi et al. | |
| 2016/0276727 A1* | 9/2016 | Dang | H01P 5/02 |

OTHER PUBLICATIONS

Extended European Search Report in corresponding European Application No. 16170674.2 dated Oct. 24, 2016 (9 pages).

* cited by examiner

*Primary Examiner* — Andargie M Aychillhum
(74) *Attorney, Agent, or Firm* — Osha Liang LLP

(57) ABSTRACT

A waveguide. The waveguide may include a first waveguide region that includes a signal trace with a first width. The waveguide may further include a second waveguide region that includes the signal trace with a second width. The first width may be different from the second width. The signal trace may be configured to transmit an electrical signal. The signal trace with the second width may be configured to couple with an integrated circuit.

11 Claims, 5 Drawing Sheets

US 9,867,294 B2

MULTI-WIDTH WAVEGUIDES

BACKGROUND

Radio frequency (RF) circuits may transmit various electrical signals to various circuit components at very high frequencies. As such, RF circuits may be designed to provide low loss transmission lines for the electrical signals, while being able to provide suitable interconnection between signal traces and various circuit components, such as microprocessors.

SUMMARY

In general, in one aspect, the invention relates to a waveguide. The waveguide includes a first waveguide region that includes a signal trace with a first width. The waveguide further includes a second waveguide region that includes the signal trace with a second width. The first width is different from the second width. The signal trace is configured to transmit an electrical signal. The signal trace with the second width is configured to couple with an integrated circuit.

In general, in one aspect, the invention relates to a system for providing an electrical transmission line. The system includes a waveguide that includes a signal trace, a first waveguide region, and a second waveguide region. The first waveguide region includes the signal trace with a first width. The second waveguide region includes the signal trace with a second width. The first width is different from the second width. The system further includes an integrated circuit coupled to the signal trace with the second width. The signal trace is configured to transmit an electrical signal to the integrated circuit.

In general, in one aspect, the invention relates to a method of manufacturing. The method includes disposing a signal trace on a first substrate and a second substrate. The signal trace has a first width above the first substrate and a second width above the second substrate. The first width is different from the second width. The method further includes forming a first ground plane underneath the first substrate and opposite the signal trace for a first waveguide region. The method further includes forming a second ground plane underneath the second substrate and opposite the signal trace for a second waveguide region. The signal trace is configured to transmit an electrical signal through the first waveguide region and the second waveguide region.

Other aspects of the invention will be apparent from the following description and the appended claims.

DETAILED DESCRIPTION

Figure 1:
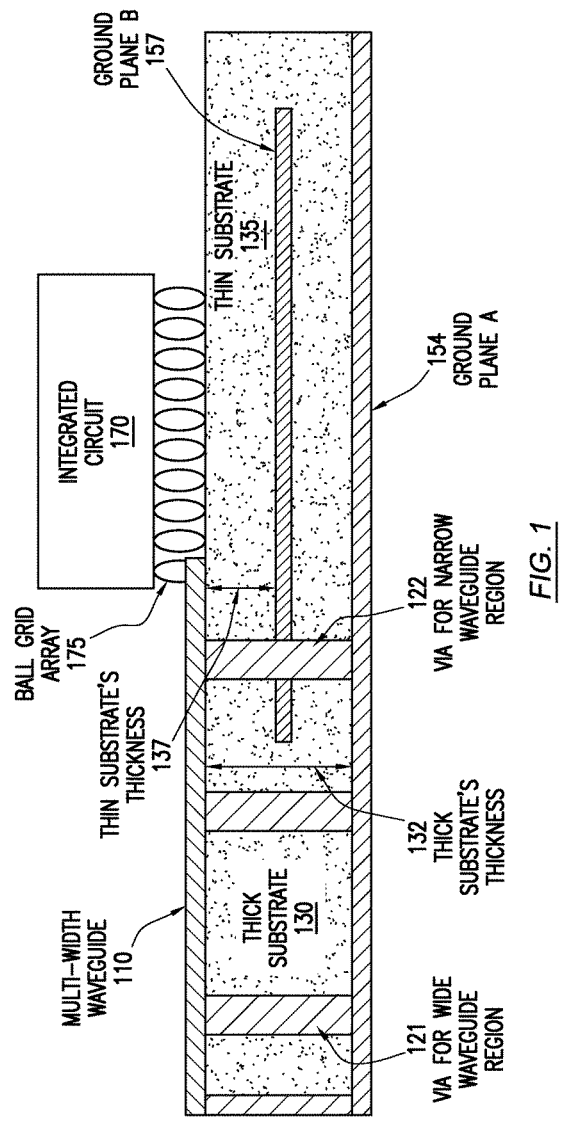
FIG. 1 shows a system in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments are directed towards a waveguide, a system comprising a waveguide, and a method for manufacturing a waveguide. The waveguide includes multiple regions and a signal trace that has different widths in different regions. The waveguide may also include multiple ground planes separated by substrates of different thicknesses, and one or vias that connect the multiple ground planes.

FIG. 1 shows a side view of a system for providing an electrical transmission line in accordance with one or more embodiments. In one or more embodiments, the system as shown in FIG. 1 includes a multi-width waveguide (110) connected to one or more integrated circuits (e.g., integrated circuit (170)). The multi-width waveguide (110) may include various substrates (e.g., thick substrate (130), thin substrate (135)) and one or more ground planes (e.g., ground plane A (154), ground plane B (157)). In one or more embodiments, the one or more integrated circuits (170) are mounted to the waveguide (110) using a ball grid array (175). For example, the ball grid array (175) may be a surface-mount packaging for coupling the integrated circuit (170) directly to the multi-width waveguide (110). In one or more embodiments, the substrates (130, 135) are substrate regions of a single substrate.

In one or more embodiments, the multi-width waveguide (110) is a circuit element that directs an electrical signal and its electro-magnetic energy along a circuit path. For example, a waveguide may be a structure that directs the propagation of the electrical signal between various locations, e.g., two locations on a printed circuit board. As such, the waveguide may confine the electro-magnetic energy within the structure in order to prevent electro-magnetic energy from dissipating into various surrounding mediums, such as into the air. In one or more embodiments, for example, the electro-magnetic energy may be from an electrical signal propagating at a radio frequency, such as in the tremendously high frequency (THF) band (i.e., a frequency greater than 300 GHz and a wavelength smaller than a millimeter). In one or more embodiments, for example, a waveguide may provide a transmission line between various circuit components.

Figure 2:
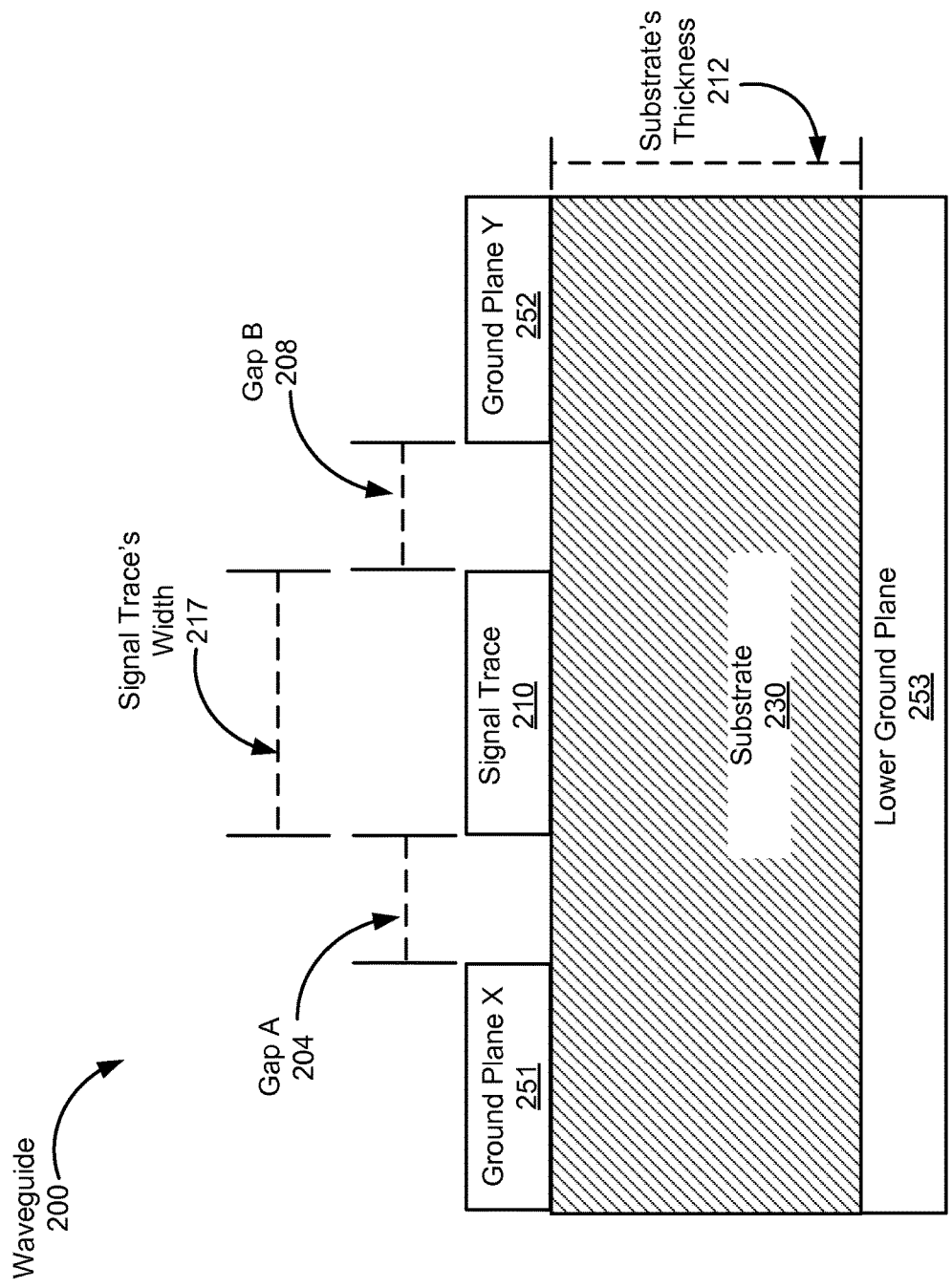
FIG. 2 shows a waveguide in accordance with one or more embodiments.

FIG. 2 shows a cross-sectional view of a waveguide (200) in accordance with one or more embodiments. In one or more embodiments, a waveguide (200) as shown in FIG. 2 includes a signal trace (e.g., signal trace (210)), one or more ground planes (e.g., ground plane X (251), ground plane Y (252), lower ground plane (253)), and a substrate (e.g., substrate (230)). The signal trace (210) may be conducting material configured for carrying an electrical signal across a printed circuit board. The ground planes (251, 252, 253) may include conducting material configured as a return path for an electrical signal transmitted through the signal trace (210). Various gaps (e.g., gap A (204), gap B (208)) may be located between the signal trace (210) and the ground planes X and Y (251, 252). Specifically, the gaps may be open spaces of air between a corresponding ground plane (e.g., ground plane X (251) or ground plane Y (252)) and the signal trace (210). In one or more embodiments, the lower ground plane (253) is disposed on the other side of the substrate (230) opposite the signal trace (210). In one or more embodiments, the substrate (230) is a dielectric medium where electro-magnetic energy for an electrical signal may be contained as the electrical signal propagates through the signal trace (210). As such, various ground planes (e.g., ground plane X (251), ground plane Y (252), and lower ground plane (253)) in the waveguide (200) may be configured as various reflective surfaces to prevent the electro-magnetic energy from escaping the waveguide (200).

Those skilled in the art, having the benefit of this detailed description, will appreciate that the waveguide (200) may be referred to as a grounded coplanar waveguide (GCWG).

In one or more embodiments, various physical properties of the waveguide (200) are selected to produce a predetermined characteristic impedance. Specifically, the size of gap A (204), the size of gap B (208), the signal trace's width (217), the substrate's thickness (212), the width of the substrate (230), and/or various material types in the substrate's (230) and/or the ground planes' composition may be selected to produce a waveguide with a particular characteristic impedance (e.g., 50Ω). For example, the waveguide (200) may be configured with an output impedance to match the input impedance of an integrated circuit connected to the waveguide (200).

Returning to FIG. 1, in one or more embodiments, the multi-width waveguide (110) is configured with a signal trace (not shown in FIG. 1) having various widths. For example, the multi-width waveguide (110) may include a wide waveguide region and a narrow waveguide region. In the wide waveguide region, the signal trace may have a larger width than the signal trace in the narrow waveguide region. As such, the signal trace may have less signal loss in the wide waveguide region, and more signal loss in the narrow waveguide region. In one or more embodiments, wide waveguide region makes up the majority of the waveguide length, while the narrow waveguide region connects the wide waveguide regions with a circuit component requiring, or at least benefiting from (e.g., impedance matching), a narrow signal trace. In one or more embodiments, the wide waveguide region is one waveguide and the narrow waveguide region is a separate waveguide.

In one or more embodiments, various physical dimensions of a substrate (e.g., thick substrate's thickness (132) and/or thin substrate's thickness (137)) are configured to match impedance between the multi-width waveguide (110) and the integrated circuit (170). In one or more embodiments, for example, if the integrated circuit (170) has an input impedance of 50Ω, the thin substrate's thickness (137) or width (not shown) may be configured with a specific dimension to obtain the desired 50Ω impedance from the perspective of the integrated circuit (170).

In one or more embodiments, various vias are disposed through the system shown FIG. 1. For example, the vias may include conducting material for connecting various layers in a printed circuit board. In one or more embodiments, a via for the wide waveguide region (121) connects a ground plane on top (not shown) with the ground plane A (154). In one or more embodiments, a via for the narrow waveguide region (122) connects the ground plane A (154), the ground plane B (157), and the ground plane on top (not shown). As such, the via for the narrow waveguide region (122) may connect various ground planes used by the wide waveguide region and the narrow waveguide region.

In one or more embodiments, a narrow waveguide region of the multi-width waveguide (110) is configured to couple with one or more connector pads (also called solder pads) of the ball grid array (175). As such, the width of a signal trace in the narrow waveguide region may align with the one or more interconnection pins.

Figure 3:
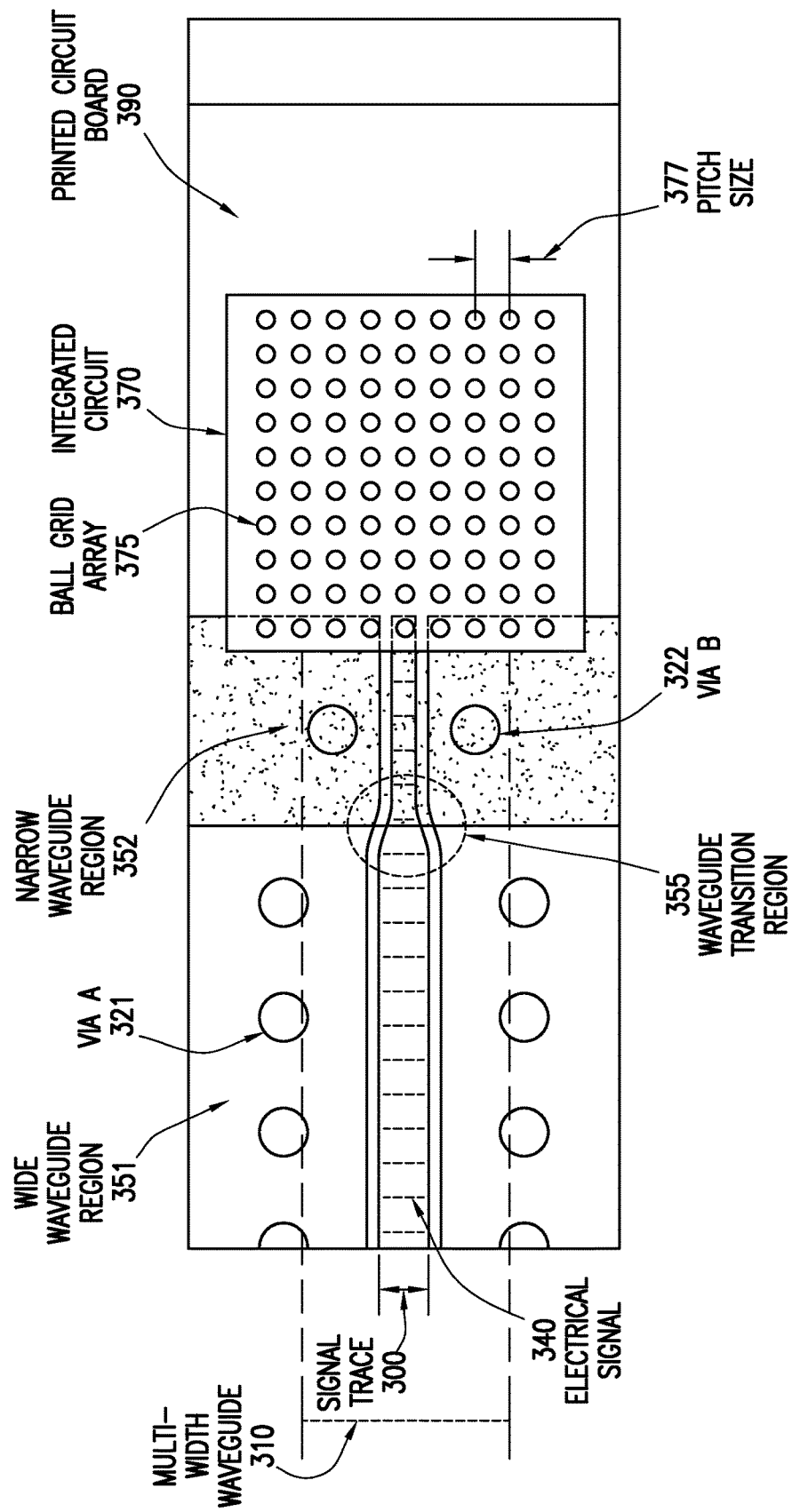
FIG. 3 shows a system in accordance with one or more embodiments.

FIG. 3 shows a top view of a system in accordance with one or more embodiments. In one or more embodiments, a system as shown in FIG. 3 includes a printed circuit board (e.g., printed circuit board (390)), one or more waveguides (e.g., multi-width waveguide (310)) having one or more waveguide regions (e.g., wide waveguide region (351), narrow waveguide region (352), waveguide transition region (355)), one or more signal traces (e.g., signal trace (300)), various vias (e.g., via A (321), via B (322)), and one or more integrated circuits (e.g., integrated circuit (370)). In one or more embodiments, the one or more signal traces (300) are configured to carry one or more electrical signals (e.g., electrical signal (340)) through a printed circuit board (PCB) (e.g., printed circuit board (390)).

In one or more embodiments, the integrated circuit (370) is mounted to the printed circuit board (390) using a ball grid array (375). Specifically, the ball grid array (375) may include various solder pads having a pitch size (377) between a pair of solder pads. For example, the solder pads may be composed of copper. Furthermore, the solder pads may provide connectivity between the integrated circuit (370) and the signal trace (300). In one or more embodiments, the width of the signal trace (300) is selected to substantially align with the pitch size (377) to form an interconnection between the multi-width waveguide (310) and the integrated circuit (370).

In one or more embodiments, the thickness of the substrate (not shown) below the wide waveguide region (351) exceeds the thickness of the substrate (not shown) below the narrow waveguide region (352). As such, in one or more embodiments, the wide waveguide region (351) provides a less lossy waveguide for the electrical signal (340) traveling over the printed circuit board (390), while the narrow waveguide region (352) provides a waveguide for the interconnection between the signal trace (300) and the integrated circuit (370).

In one or more embodiments, the multi-width waveguide (310) is configured to implement various electronics interconnections. For example, a chip-to-package interconnection and/or a package-to-PCB interconnection may be implemented using the multi-width waveguide (310) for connecting the signal trace (300) to the integrated circuit (370). In one or more embodiments, the integrated circuit (370) is mounted directly on the printed circuit board (390) and without an interconnection assembly. Furthermore, the multi-width waveguide (310) may provide for interconnecting the integrated circuit (370) with the signal trace (300) using various new material types, such as glass, for the interconnection instead of existing organic printed circuit board materials. Thus, the multi-width waveguide (310) may eliminate an interconnection packaging between the signal trace (300) and the integrated circuit (370).

In one or more embodiments, the multi-width waveguide (310) includes a waveguide transition region (355) between the wide waveguide region (351) and the narrow waveguide region (352). In the waveguide transition region (355), the width of the signal trace (300) may change from one waveguide region to the next adjacent waveguide region (e.g., the width of the signal trace (300) may decrease in size traveling from the wide waveguide region (351) to the narrow waveguide region (352) as shown in FIG. 3). In one or more embodiments, in the waveguide transition region (355), the multi-width waveguide (310) is configured to switch from one ground plane to a different ground plane for use in the multi-width waveguide (310) (e.g., a change from ground plane A (154) to ground plane B (157) in FIG. 1). In one or more embodiments, the waveguide transition region (355) includes a change in the thickness of the multi-width waveguide's (310) substrate from a first thickness to a second thickness (e.g., a change from the thick substrate's thickness (132) to the thin substrate's thickness (137) in FIG. 1.). The change in the width of the signal trace (300) and/or the thickness of the multi-width waveguide's substrate may be gradual, in predetermined increments, or by any other applicable method.

Figure 4:
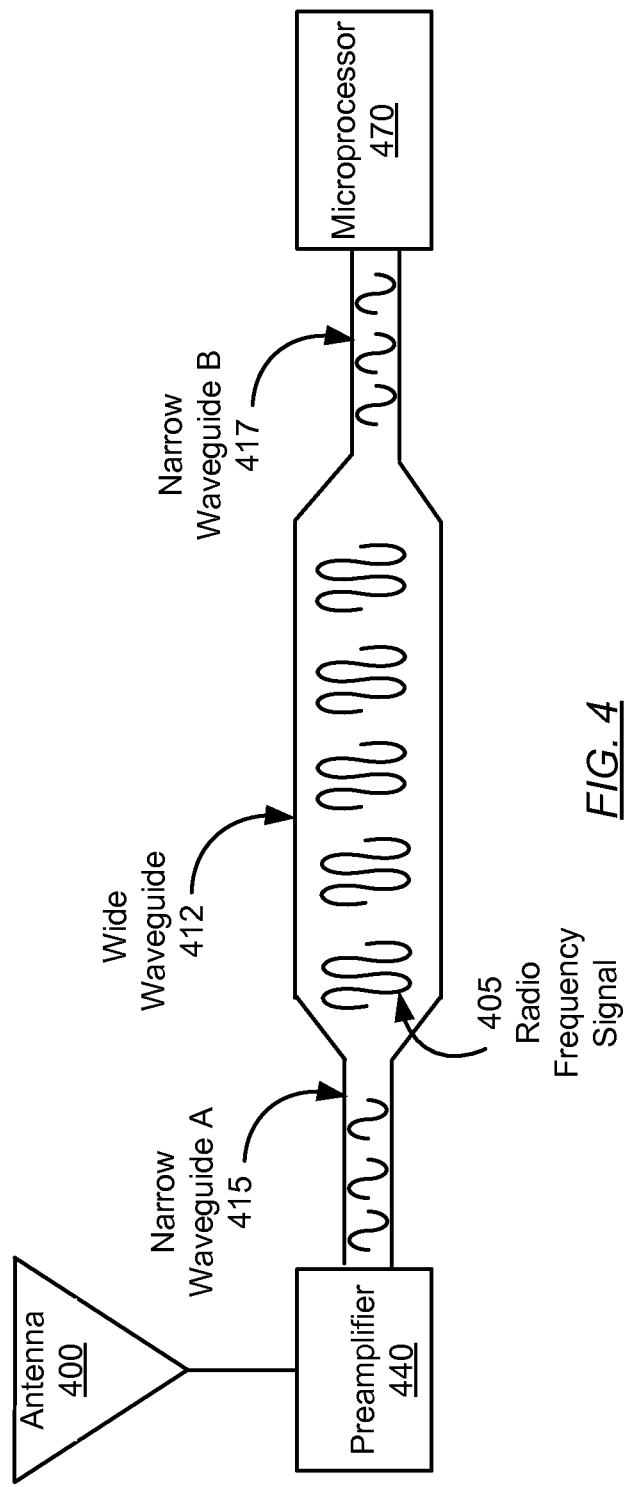
FIG. 4 shows an example application of a waveguide in accordance with one or more embodiments.

FIG. 4 provides an example of a radio frequency system. The following example is for explanatory purposes only and is not intended to limit the scope of the invention.

In FIG. 4, a radio frequency system is shown that includes an antenna (400), a preamplifier (440), a microprocessor (470), a narrow waveguide A (415), a wide waveguide (412), and a narrow waveguide B (417). The antenna (400) may be, for example, a broadside antenna or a patch antenna. As such, a radio frequency (RF) signal (405) is received from the antenna (400) by the preamplifier (440) and transmitted into the narrow waveguide A (415). Specifically, the narrow waveguide A (415) transitions into the wide waveguide (412), and the wide waveguide (412) transitions into the narrow waveguide B (417). Thus, the narrow waveguide A (415) may couple with the preamplifier (440) for receiving the RF signal (405). The RF signal (405) may pass through the narrow waveguide A (415) to the wide waveguide (412) and into the narrow waveguide B (417), respectively. With the narrow waveguide B (417) coupled to the microprocessor (470), the RF signal may arrive at the microprocessor (470).

Figure 5:
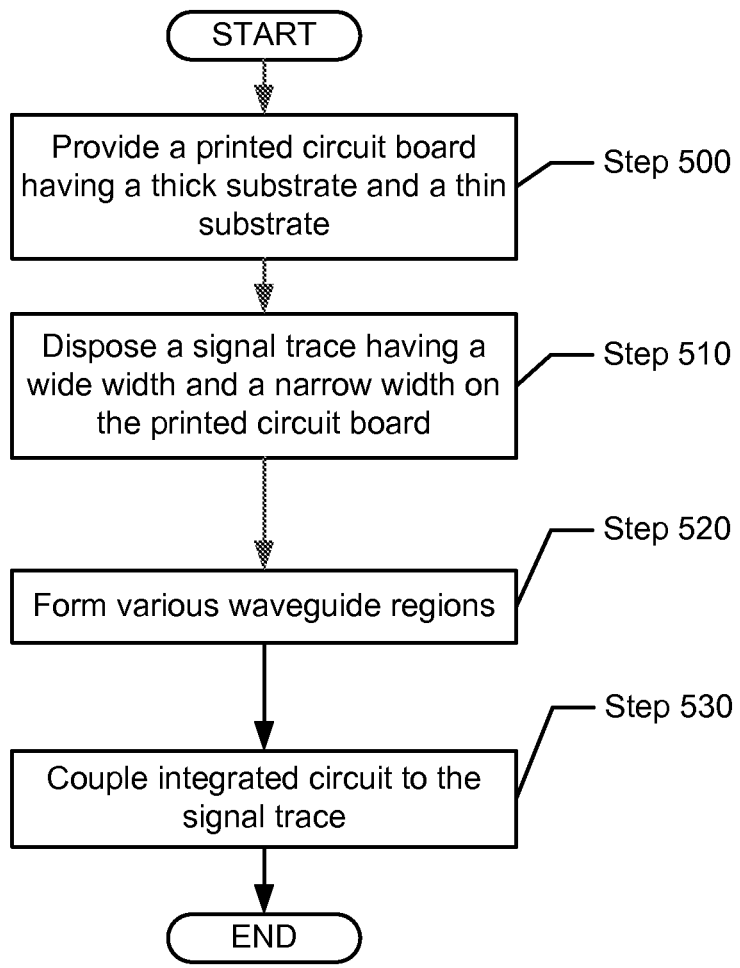
FIG. 5 shows a flowchart in accordance with one or more embodiments.

FIG. 5 shows a flowchart in accordance with one or more embodiments. Specifically, the process depicted in FIG. 5 may be used to manufacture a waveguide. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 500, a printed circuit board is provided having a thick substrate and a thin substrate in accordance with one or more embodiments. For more information on thick substrates and thin substrates, see FIG. 1 and the accompanying description.

In Step 510, a signal trace having a wide width and a narrow width is disposed on the printed circuit board in accordance with one or more embodiments. For example, the wide width of the signal trace may provide a transmission line for carrying an electrical signal with less signal loss (i.e., less attenuation) than the portion of the signal trace with the narrow width. In one or more embodiments, the narrow width of the signal trace is selected to match, within a tolerance, the pitch size of the pin connectors for an integrated circuit to be connected to the waveguide. For more information on signal traces, see FIGS. 2-3 and the accompanying description.

In Step 520, various waveguide regions are formed in accordance with one or more embodiments. For example, the waveguide regions may be formed from the signal trace in Step 510. In one or more embodiments, various ground planes are disposed on the thick substrate and the thin substrate to form the waveguide regions. In one or more embodiments, various ground planes are disposed underneath the thick substrate and the thin substrate and opposite the signal trace to form the waveguide regions. In one or more embodiments, one or more ground planes are formed inside the printed circuit board to form a narrow waveguide region.

In one or more embodiments, a grounded coplanar waveguide (GCWG) is formed in the printed circuit board. For example, various ground planes may be disposed on top of the printed circuit board with a predetermined gap between the ground planes and the signal trace. Furthermore, the ground planes may be formed underneath the thick substrate and/or the thin substrate to form a GCWG within the printed circuit board. In one or more embodiments, one or more multi-width waveguides are formed in the printed circuit board with the signal trace. For more information on waveguides, see FIGS. 1-2 and the accompanying description.

In Step 530, an integrated circuit is coupled to the signal trace in accordance with one or more embodiments. In one or more embodiments, for example, the integrated circuit is coupled to the signal trace with a narrow width. In one or more embodiments, the integrated circuit is bonded to the printed circuit board using surface-mount packaging technology, such as a ball array grid packaging, or any other applicable technique. For more information on coupling integrated circuits to the signal trace, see FIGS. 1 and 3 and the accompanying description.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A waveguide, comprising: a first waveguide region comprising a first portion of a signal trace disposed on a continuous surface of a single planar substrate, wherein the first portion comprises a first width; and a second waveguide region comprising a second portion of the signal trace disposed on the continuous surface of the single planar substrate, wherein the second portion comprises a second width, wherein the first width is different from the second width, wherein the signal trace is configured to transmit an electrical signal along a direction perpendicular to the first width and the second width, and wherein the signal trace with the second width is configured to couple with an integrated circuit, wherein the first waveguide region further comprises a first portion of the single planar substrate comprising a first thickness and a first ground plane disposed underneath the first portion and opposite the signal trace, wherein the second waveguide region further comprises a second portion of the single planar substrate comprising a second thickness and a second ground plane disposed underneath the second portion and opposite the signal trace, and wherein the first thickness exceeds the second thickness.

2. The waveguide of claim 1,
wherein the single planar substrate comprises a dielectric medium configured to contain electro-magnetic energy during transmission of the electrical signal through the signal trace, and
wherein the dielectric medium is continuous throughout at least the first portion and the second portion of the single planar substrate.

3. The waveguide of claim 1, further comprising:
a transition region comprising a third portion of the signal trace and located between the first waveguide region and the second waveguide region.

4. The waveguide of claim 1, further comprising:
a third ground plane disposed on the continuous surface of the single planar substrate, wherein the signal trace is separated from the third ground plane by a substantially constant gap in the first waveguide region and the second waveguide region.

5. The waveguide of claim 4, further comprising:
a via connecting the third ground plane, the second ground plane, and the first ground plane,
wherein the single planar substrate comprises a substantially constant thickness, and
wherein the second ground plane is disposed on an internal layer surface in the single planar substrate.

6. The waveguide of claim 1, wherein each of the first waveguide region and the second waveguide region is a grounded coplanar waveguide (GCWG).

7. A system for providing an electrical transmission line, comprising: a waveguide comprising a signal trace disposed on a continuous surface of a single planar substrate, a first waveguide region, and a second waveguide region, wherein the first waveguide region comprises a first portion of the signal trace with a first width, wherein the second waveguide region comprises a second portion of the signal trace with a second width, and wherein the first width is different from the second width; and an integrated circuit coupled to the signal trace with the second width, wherein the signal trace is configured to transmit, along a direction perpendicular to the first width and the second width, an electrical signal to the integrated circuit, wherein the first waveguide region further comprises a first portion of the single planar substrate comprising a first thickness and a first ground plane disposed underneath the first portion and opposite the signal trace, wherein the second waveguide region further comprises a second portion of the single planar substrate comprising a second thickness and a second ground plane disposed underneath the second portion and opposite the signal trace, and wherein the first thickness exceeds the second thickness.

8. The system of claim 7,
wherein the integrated circuit is coupled to the signal trace with the second width using a ball grid array having a plurality of solder pads,
wherein the plurality of solder pads comprises a predetermined pitch size between a respective pair of the plurality of solder pads,
wherein the signal trace with the second width substantially aligns with the predetermined pitch size, and
wherein the second width and the predetermined pitch size substantially match each other and are perpendicular to the direction of transmitting the electrical signal.

9. The system of claim 7, further comprising:
wherein the waveguide comprises a transition region,
wherein the transition region comprises a third portion of the signal trace and is located between the first waveguide region and the second waveguide region.

10. The system of claim 7, further comprising:
a third ground plane disposed on the continuous surface of the single planar substrate, wherein the signal trace is separated from the third ground plane by a substantially constant gap in the first waveguide region and the second waveguide region.

11. The system of claim 10, further comprising:
a via connecting the third ground plane, the second ground plane, and the first ground plane,
wherein the single planar substrate comprises a substantially constant thickness, and
wherein the second ground plane is disposed on an internal layer surface in the single planar substrate.

* * * * *